United States Patent [19]

Larsen et al.

[11] 4,008,610
[45] Feb. 22, 1977

[54] SELF-BALANCING D.C.-SUBSTITUTION MEASURING SYSTEM

[75] Inventors: Neil T. Larsen, Boulder; Gerome R. Reeve, Lafayette, both of Colo.

[73] Assignee: The United States of America as represented by the Secretary of Commerce, Washington, D.C.

[22] Filed: June 17, 1975

[21] Appl. No.: 587,565

Related U.S. Application Data

[63] Continuation-in-part of Ser. No. 476,646, June 5, 1975, abandoned.

[52] U.S. Cl. .................................. 73/204; 324/95; 324/106
[51] Int. Cl.$^2$ ..................... G01F 1/68; G01R 21/02
[58] Field of Search ................ 73/190 R, 204, 355; 324/95, 106

[56]    References Cited
UNITED STATES PATENTS

| | | | |
|---|---|---|---|
| 2,997,652 | 8/1961 | Engen | 324/106 |
| 3,597,676 | 8/1971 | Moore | 73/204 |
| 3,611,130 | 10/1971 | Larsen et al. | 324/106 |

*Primary Examiner*—Herbert Goldstein
*Attorney, Agent, or Firm*—Eugene J. Pawlikowski; Alvin Englert

[57]     ABSTRACT

A self-balancing D.C.-substitution R.F. power measuring system includes first and second high gain differential operational amplifiers, a bolometer element, and a reference resistor element. The amplifiers and the two elements are connected in a current loop with one of the elements connected between the output terminals from the differential amplifiers and the other of the elements connected between center points of isolated dual power supplies associated with each of the amplifiers. The inputs to one amplifier are connected from an adjacent end of one of the elements and the far end of the other element, while the inputs to the second amplifier are connected to the far end of the one element and the adjacent end of the other element. Current flows out of one amplifier and into the other. The current is driven to a value which maintains the potential between the input terminals of the first amplifier essentially equal to zero and the potential between the input terminals of the second amplifier essentially equal to zero. Thus, the current drives the value of the bolometer element to a resistance which is equal to the resistance of the reference element. An output connection to a voltmeter may be taken between corresponding ends of the elements. The bolometer element may be a thermistor or a barretter. The system may also be used in a hot-wire anemometer. In another version of the system, the current loop is established with one of the elements connected between the output of one amplifier and the center point of the power supply of the other amplifier and the other of the elements connected between the output of the other amplifier and the center point of the power supply of the one amplifier; the input connections to the amplifiers are taken from the same points, but with the input leads to the second amplifier interchanged.

18 Claims, 9 Drawing Figures

SELF-BALANCING D.C.-SUBSTITUTION MEASURING SYSTEM

This application is a continuation-in-part of our application Ser. No. 476,646 filed June 5, 1975 now abandoned.

BACKGROUND OF THE INVENTION

It has been the practice in the prior art to obtain highly accurate measurements of microwave or radio frequency power by employing bolometers and the D.C.-substitution technique. Self-balancing systems of this character are disclosed, for example, in Engen U.S. Pat. No. 2,997,652 and Larsen et al. U.S. Pat. No. 3,611,130. These prior art self-balancing systems make use of a Wheatstone bridge, one arm of which comprises a bolometer element, such as a thermistor or barretter. An amplifier which is connected across one diagonal of the bridge senses the magnitude and direction of unbalance of the bridge and forces a current through the other diagonal of the bridge so as to drive the bolometer resistance up or down until the bridge is balanced.

Although systems of this kind are highly accurate, they are nevertheless subject to a number of drawbacks. As R.F. power is dissipated in the bolometer, the common-mode voltage at the amplifier input changes. For this reason, an amplifier having a very high common-mode rejection ratio (CMRR) is required for accurate measurement of the substituted D.C. power.

Since the terminal surface of the R.F. portion of a system often dictates the location of the bolometer mount, the bolometer is typically located at some distance from the other three arms of the self-balancing bridge. It is not common practice, nor is it usually feasible, to separate the resistances associated with the leads to the bolometer from the resistance of the bolometer itself. This causes a first-order error in the measurement of the substituted power, unless the actual lead resistances are measured separately and corresponding corrections are calculated for each different set of leads.

The degradation of the signal-to-noise ratio is the most serious and most subtle problem associated with the prior art systems. Equivalent noise voltage generators may be considered as located in the series with each of the input leads of the balancing amplifier. If there is no feed-back from the output of the amplifier to the inverting input, the noise will be amplified by the full open-loop gain of the amplifier and will appear at the top of the bridge, the point from which the output signal is taken. Microvolts of noise at the input of the amplifier would thus result in volts of noise at the output, and this would be particularly true if the bridge were perfectly balanced at all frequencies. It is the purpose of the system to maintain the bridge in balance as exactly as possible, thus resulting in noise at the output at those frequencies where the attenuation of the feed-back is high and the amplifier has gain. In actuality, there is feed-back, but only to the extent that the amplifier fails to balance perfectly the bridge in a dynamic sense. These two conflicting requirements result in a serious degradation of the signal-to-noise ratio at the top of the bridge. This degradation is particularly serious when small R.F. power levels are to be measured, because the change in the D.C. voltage at the output is also then small. This conflict is an intrinsic defeat in all systems which use a self-balancing bridge technique.

SUMMARY OF THE INVENTION

It is accordingly the principal object of the present invention to provide a self-balancing D.C.-substitution measuring system which overcomes the aforementioned defects of prior art systems.

In particular it is an object of the present invention, to provide a self-balancing D.C.-substitution measuring system which does not require amplifiers having a very high common-mode rejection ratio.

It is a further object of the invention, to provide a self-balancing D.C.-substitution measuring system in which the resistance of the leads to the bolometer does not introduce significant error.

It is a further object of the invention, to provide a self-balancing D.C.-substitution measuring system in which the aforementioned serious degradation of the signal-to-noise ratio is avoided.

To these ends, according to the present invention, a self-balancing D.C.-substitution measuring system is proposed which does not employ the Wheatstone bridge technique. Instead, the bolometer element, a reference resistor element and two high gain operational amplifiers with different inputs, each being supplied from a pair of dual isolated power supplies, are connected in a current loop. One of the elements is connected between the output terminals of the differential amplifiers, and the other of the elements is connected between center points of the two dual power supplies. One input terminal of one of the amplifiers is connected to an adjacent end of one of the elements, and the other input terminal of the one amplifier is connected to the far end of the other element. An adjacent end of the one element is connected to one input terminal of the second amplifier, and the far end of the other element is connected to the second input terminal of the second amplifier. One of the amplifiers supplies current to the current loop, and the second amplifier serves as a sink for this current. Current thus flows out of the one amplifier and into the second amplifier. The current assumes a value which maintains the potential between the two input terminals of the first amplifier essentially equal to zero and the potential between the two input terminals of the second amplifier essentially equal to zero. The resistance of the reference resistor element is independent of the current flowing through it. The resistance of the bolometer element is determined by its temperature and therefore varies with current. The current through the bolometer element is identical to the current through the reference element due to the action of the two amplifiers. The voltage across the reference element is identical to the voltage across the bolometer element, also due to the action of the two amplifiers. (Two amplifiers are required to accomplish both of these conditions simulataneously.) Therefore, since equal voltage drops appear across the two elements for the same current through both, their resistances must be identical. Thus, the current drives the resistance of the bolometer element to the value of the resistance of the reference resistor. In one embodiment, the one element is the reference resistor, and the other element is the bolometer element in the form of a thermistor. In a second embodiment, the one element is the bolometer element in the form of a thermistor and the second element is the reference resistor. In a third embodiment, the one element is the bolometer element in the form of a barretter, and the other element is the reference resistor. In a fourth embodiment, the one element is the reference resistor, and the other element is the bolometer element in the form of a barretter. In each of the embodiments, a voltmeter may be connected between corresponding ends of the elements, that is, between the first input terminal of the first amplifier and the second input terminal of the second amplifier, or vice versa. Four additional embodiments are derived from these four embodiments by interchanging the leads connected to the output from the second amplifier and its power supply common and interchanging the two input leads to the second amplifier.

These and other objects, features, and advantages of the present invention will become more readily apparent from a detailed description of the invention with reference to the accompanying drawings.

DETAILED DESCRIPTION OF THE PREFERRED EMBODIMENTS

Figure 1:
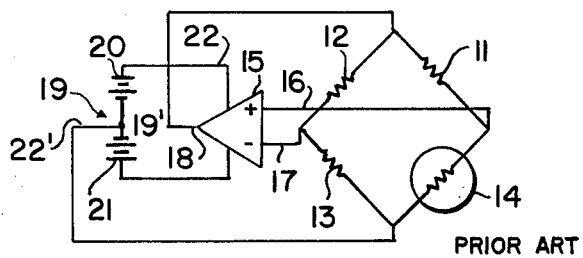
FIG. 1 is a schematic diagram of a prior art self-balancing D.C.-substitution measurement system.

A typical prior art self-balancing D.C.-substitution R.F. power measuring system of the Wheatstone bridge type is shown in FIG. 1. The system includes a Wheatstone bridge 10 having fixed resistor arms 11, 12, and 13. A bolometer element 14 comprises the fourth arm of the bridge. A high gain operational amplifier 15 has a pair of differential inputs connected by leads 16 and 17 across one diagonal of the bridge and an output terminal connected by lead 18 to the top of the bridge. A dual power supply 19 includes a pair of batteries 20 and 21 connected by a center point 19'. Opposite ends of the power supply are connected by leads 22 and 23 to bias terminals of amplifier 15, and center point 19' is connected by lead 22' to the lower end of the bridge. In operation, amplifier 15 senses the magnitude and direction of unbalance of the bridge and forces a current through lead 18 into the top of the bridge in such a manner that the resistance of bolometer element 14 is driven up or down until the bridge is balanced. Bolometer element 14 may be a negative-temperature coefficient thermistor. If a positive-temperature coefficient barretter is used as the bolometer element, it may be placed in an adjacent arm, or the input leads to amplifier 15 may be reversed. When making a radio frequency power measurement using the system of FIG. 1, a measurement is first made with no radio frequency energy applied to bolometer element 14 by measuring the voltage $V_1$ between the top and bottom curves of bridge 10. Then, with radio frequency energy applied to bolometer element 14, the measurement is repeated and the voltage $V_2$ between the top and bottom corners of bridge 10 is determined. Since the power will vary as the square of the voltage divided by the resistance, the power in the first, or direct current case, $P_{dc}$ will be proportional to $V_1^2$, while the power $P'_{dc}$ for the case with radio frequency power applied to bolometer element 14 will be proportional to $V_2^2$. The radio frequency power $P_{rf}$ will be equal to $P_{dc} - P'_{dc}$. A fuller disclosure of prior art systems of this character is found in Engen U.S. Pat. No. 2,997,652 and in Larsen et al. U.S. Pat. No. 3,611,130, and a detailed analysis of the system disclosed in U.S. Pat. No. 3,611,130 is found in a Larsen et al. paper entitled "The NBS Type II Power Measurement System" found in *ISA Conference Proceedings*, 1970, Vol. 25, Part 3, pp. 712–770.

As previously explained, self-balancing Wheatstone bridge systems of this character are subject to a number of problems. First, as radio frequency power is dissipated in bolometer element 14, there is a change in the common-mode voltage at the input of amplifier 15. Thus, for accurate measurements, it is necessary to employ as amplifier 15 an amplifier having a very high common-mode rejection ratio.

Second, it is customary to locate the bolometer element 14 some distance from the other three arms 11, 12, and 13 of Wheatstone bridge 10, thus necessitating the use of long leads between the ends of bolometer element 14 and its connections to bridge 10. The resistance of these leads will introduce a first-order error in the measurement of the substituted power, unless the actual lead resistances are measured separately and corresponding corrections are calculated for each different set of leads.

Third, equivalent noise voltage generators may be considered as being in series with each of the input leads 16 and 17 of amplifier 15. The noise generated by these equivalent noise voltage generators will be amplified by the full open-loop gain of the amplifier and will appear at the top of the bridge, which is the output point from which the output signal is taken. Thus, there will be a serious degradation of the signal-to-noise ratio at the output of the system, and this signal-to-noise ratio degradation will be particularly serious when small R.F. power levels are to be measured because of the small change in the D.C. voltage.

These problems are avoided in the system of the present invention which does not employ a self-balancing Wheatstone bridge. Turning first to the embodiment of FIG. 2, it will be seen that the measuring system includes a four-terminal transducer resistor or bolometer element 30 comprising a negative-temperature coefficient thermistor T and having two terminals C and C' at one end and two terminals D and D' at the other end. A relatively stable, substantially temperature independent reference resistor 32 having a resistance value R is also supplied as a four-terminal element having a pair of terminals A and A' at one end and a pair of terminals B and B' at the other end. For high accuracy applications, a wire-wound resistor may be used as reference resistor 32; where less accuracy is acceptable, a metal film resistor could be used. The transducer resistor and reference resistor elements are connected in a current loop by a pair of high gain operational amplifiers 34 and 44, each of which have differential inputs. Amplifier 34 has a first input 35 connected to terminal A of reference resistor 32 and a second input 36 connected to terminal D of bolometer element 30. The output 37 from amplifier 34 is connected to one end of reference resistor 34 by connection to terminal A'. An isolated dual power supply 38 supplies direct current power from a pair of batteries 39 and 40 through leads 41 and 42 to bias terminals of amplifier 34. A center point 38' of dual power supply 38 is connected by a lead 43 to a terminal C' of bolometer element 30. The other amplifier 44 has a first input lead 45 connected to terminal B of reference resistor R and a second input terminal 46 connected to a terminal C of bolometer element 30. The output terminal of amplifier 44 is connected by lead 47 to a terminal B' of reference resistor element 32. An isolated dual power supply 48 supplies direct current power to amplifier 44 through leads 51 and 52 from batteries 49 and 50. A center point 48' of power supply 48 is connected by a lead 53 to a terminal D' of bolometer element 30. The output voltage is measured from between terminals A and C by a voltmeter 55.

It is to be understood, however, that an output measurement may also be taken from between terminals B and D in which case the polarity of the voltage measurement will be reversed.

It is thus to be noted that a current loop is established from output terminal 37 of amplifier 34 through resistor element 32, through amplifier 44 and its power supply 48, from center point 48' of power supply 48 through bolometer element 30, and from center point 38' through power supply 38 to amplifier 34. One of the amplifiers 34 and 44 supplies the current I to the current loop. In the example shown in FIG. 2, the current is supplied by amplifier 34; and amplifier 44 sinks this current. The loop is driven to establish the current I at a value which will maintain equal potentials at terminals A and D, which are connected to the input terminals of amplifier 34, and equal potentials at terminals B and C, which are connected to the input terminals of amplifier 44. Moreover, the current I assumes a value which will adjust the resistance of bolometer element 30 to a value equal to the resistance R of reference resistor element 32. When the resistance value of the bolometer element changes in response, for example, to applied R.F. power, the momentary inequality in the potentials to the input terminals of the amplifiers will result in an adjustment of the value of the current I to restore equality. Thus, an equilibrium will be attained with the voltage between terminals A and C being a function of the direct current power dissipation in bolometer element 30. Although it would seem from what has been stated above that the same measurement could be taken between terminals C and D, this can be shown to cause errors. Because voltmeter 55 has a finite resistance, it draws a small current. If the voltmeter were connected between terminals A and B, some of the current drawn through voltmeter 55 would flow through bolometer element 30. Likewise, if the voltage measurement were taken between terminals C and D, some of the voltmeter current would be drawn through reference resistor 32. However, if voltmeter 55 is connected between terminals A and C or between B and D, the current drawn by the voltmeter does not flow through either bolometer element 30 or reference resistor 32. Thus, connection of voltmeter 55 between terminals A and C or terminals B and D is desirable, because the voltmeter current will not affect the measuring circuit. In practice, one side of the bolometer is usually at ground potential. It is usually also desirable from noise considerations to have one side of the voltmeter 55 at ground potential as well.

Figure 2:
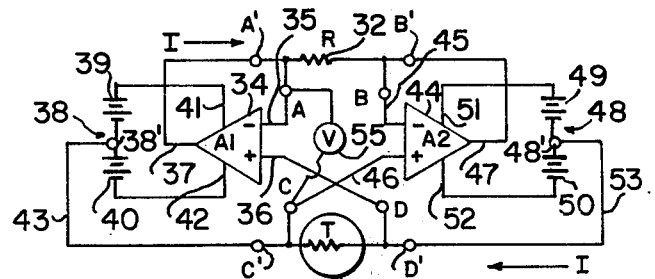
FIG. 2 is a schematic diagram of a first embodiment of a self-balancing D.C.-substitution measuring system of the present invention.
Figure 3:
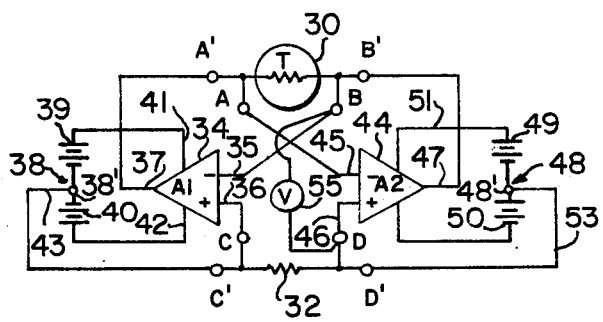
FIG. 3 is a schematic diagram of a second embodiment of the measuring system of the present invention.

The embodiment of FIG. 3 also employs a thermistor element T as bolometer element 30. However, bolometer element 30 is connected between terminals A and A' and terminals B and B' between the output terminals 37 and 47 of amplifiers 34 and 44. Reference resistor 32 is connected between terminals C and C' and terminals D and D', and resistor 32 is thus connected between center points 38' and 48' of the two dual power supplies 38 and 48. It is to be noted that input terminal 35 of amplifier 34 is connected to terminal B and that input terminal 36 of amplifier 34 is connected to terminal C. In the case of amplifier 44, input terminal 45 is connected to terminal A, while input terminal 46 is connected to terminal D. The embodiment of FIG. 3 is otherwise identical to the embodiment of FIG. 2. The voltmeter 55, however, is typically connected to terminals B and D.

Figure 4:
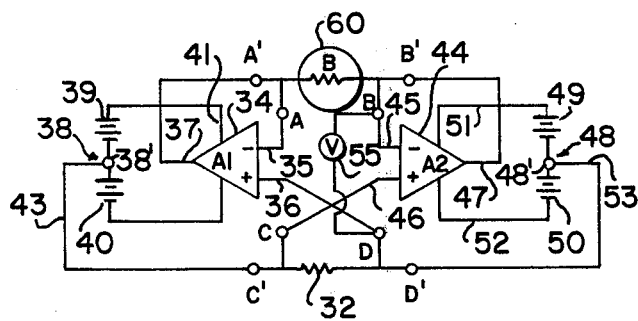
FIG. 4 is a schematic diagram of a third embodiment of the measuring system of the present invention.
Figure 5:
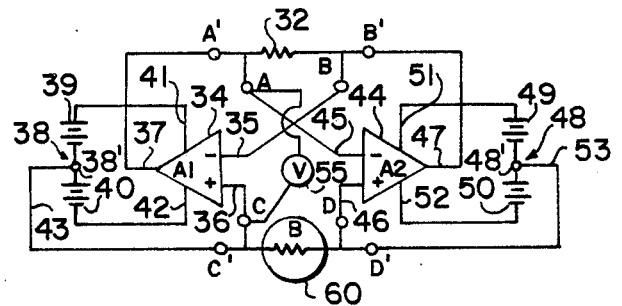
FIG. 5 is a schematic diagram of a fourth embodiment of the measuring system of the present invention.

The embodiments of FIG. 4 and FIG. 5 substitute a positive-temperature coefficient barretter B as the transducer register or bolometer element 60 for the bolometer elements 30 of FIG. 2 and FIG. 3. In FIG. 4, barretter 60 is connected between terminals A and A' and terminals B and B', while reference resistor 32 is connected between terminals C and C' and terminals D and D'. The input terminals 35 and 36 of amplifier 34 are connected, respectively, to terminals A and D, while the input terminals 45 and 46 of amplifier 44 are connected, respectively, to terminals B and C. In this embodiment, voltmeter 55 is connected between terminals B and D to obtain the same polarity output reading as obtained from the connection of voltmeter 55 to the terminals A and C in the embodiment in FIG. 2. If voltmeter 55 were to be connected between terminals A and C in the embodiment of FIG. 4, the polarity of the reading would be reversed.

In the embodiment of FIG. 5, barretter element 60 is connected between terminals C and C' and terminals D and D', while reference resistor 32 is connected between terminals A and A' and terminals B and B'. The input connections to amplifiers 34 and 44 are identical to those found in the embodiment of FIG. 3. Voltmeter 55 is connected between terminals A and C. Here, again, voltmeter 55 could be connected between terminals B and D but with an output reading reversed in polarity. The embodiments of FIG. 4 and FIG. 5 are otherwise identical to the previous embodiments as disclosed hereinabove.

Considering the operation of the measuring systems of the present invention, it is to be noted, with particular reference to the embodiment of FIG. 2, that the current loop will be driven to provide the same potential drop across reference resistor 32 and bolometer element 30. Since no current will flow in the amplifier input leads, and since no other current paths are provided other than the current loop shown, the same current I will flow in bolometer element 30 as flows in reference resistor 32. Accordingly, the resistance value of bolometer 30 must be equal to the resistance value of reference resistor 32 as the system drives to an equilibrium condition.

Since the circuits of the present invention are symmetrical, it is possible in principle for the current I to flow equally well in either direction, depending upon initial conditions. In a practical circuit, a trivial change would insure that the current always flowed in a predetermined direction, if this were important. The use of diodes in the circuit would insure the flow in a predetermined direction only. As will be apparent from a comparison of FIGS. 2, 3, 4 and 5, the substitution of positive-temperature coefficient barretters for negative-temperature coefficient thermistors is accomplished by an interchange of leads or by an interchange of the positions of the bolometer element and the reference resistor element.

When a power measurement is to be made, the reading of voltmeter 55 is first taken with no radio frequency power applied to bolometer element 30 or 60. In the case, as shown in FIG. 4, for example, where the voltmeter 55 is connected between terminals B and D, the voltage $V_{BD}$ will be measured and used to compute the direct current power $P_{dc}$ in accordance with the equation:

$$P_{dc} = V_{BD}^2/R$$

Thereafter, bolometer element 60 of FIG. 4 is exposed to the radio frequency field, the power of which is to be measured. The voltmeter reading is again taken to yield the voltage $V'_{BD}$ and the power $P'_{dc}$ will be computed from the equation:

$$P'_{dc} = V'_{BD}^2/R$$

From these two computations the radio frequency power $P_{rf}$ can be computed from the equation:

$$P_{rf} = P_{dc} - P'_{dc}$$

Increased accuracy of measurement can be achieved by the use of a stable, adjustable, external reference voltage source, in the manner described in Larsen et al. U.S. Pat. No. 3,611,130. This technique minimizes the effects of errors in the external voltmeter 55.

In the case of the embodiments of FIGS. 3 and 5, neither amplifier 34 nor 44 is required to support any common-mode voltage, other than potential drops across lead resistances. This eliminates not only the need for a high common-mode rejection ratio (CMRR), but even eliminates the requirement for a differential input amplifier, if the four-terminal feature is not needed.

In the disclosed embodiments, as shown in FIGS. 2, 3, 4, and 5, the bolometer elements 30 and 60 and the reference resistor 32 have been provided as four-terminal elements. Because the invention makes possible the use of these four-terminal elements, the resistances of the leads in the two sets of four terminals have no first-order effects on the operation of the circuit. This permits the bolometer to be remotely located as may be required in a large automated system.

Since all of the signal plus noise appearing at the outputs of each amplifier is fed back unattenuated to an inverting input, there is no degradation of the signal-to-noise ratio. The output signal is at least 20 dB quieter with this configuration than with a self-balancing Wheatstone bridge using the same amplifier. This is, perhaps, the most important advantage of the present invention.

For the embodiment of FIG. 2, the output resistance presented to measuring voltmeter 55 is zero, if the signal is taken from terminals A and C. This will result in no loading errors. Potentiometric methods are not required. Similar output points are available in the other embodiments.

Figure 6:
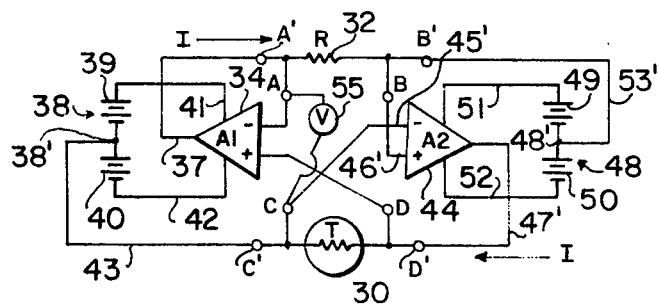
FIG. 6 is a schematic diagram of a fifth embodiment of the measuring system of the present invention.
Figure 7:
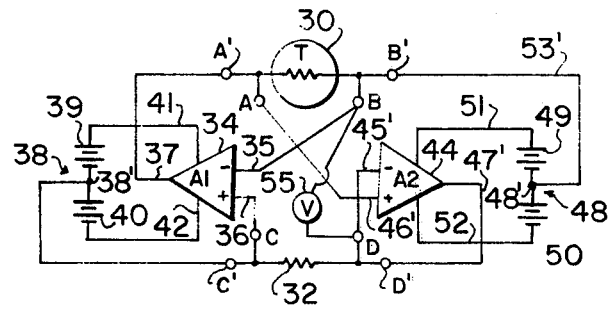
FIG. 7 is a schematic diagram of a sixth embodiment of the measuring system of the present invention.
Figure 8:
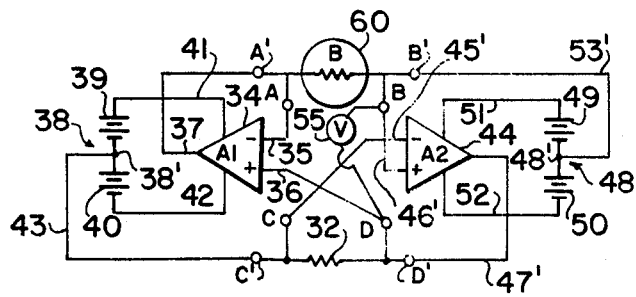
FIG. 8 is a schematic diagram of a seventh embodiment of the measuring system of the present invention.
Figure 9:
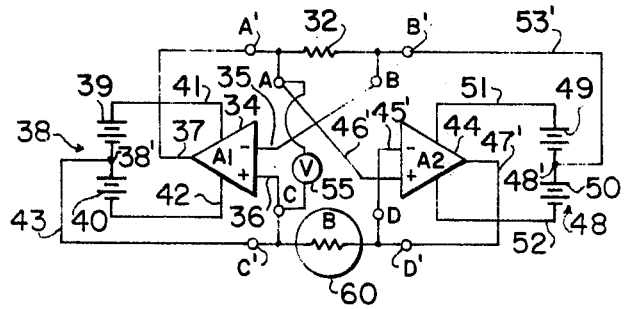
FIG. 9 is a schematic diagram of an eighth embodiment of the measuring system of the present invention.

Four additional embodiments of the invention are shown in FIGS. 6, 7, 8 and 9 and are derived, respectively, from the embodiments of FIGS. 2, 3, 4 and 5. In each case, the leads connected to the output of the second amplifier 44 and to its power supply common 48' are interchanged; and the input leads to the second amplifier 44 are interchanged at the input to the second amplifier. Thus, in the embodiment of FIG. 5, the output lead 47' from amplifier 44 is connected to terminal D' of bolometer element 30, while lead 53' from power supply common 48' is connected by lead 53' to terminal B' reference resistor 32. Input lead 45' connects the − input of amplifier 44 to terminal C of bolometer element 30, and input lead 46' connects the + input of amplifier 44 to terminal B of reference resistor 32. It will be noted that the embodiment of FIG. 6 is otherwise identical to the embodiment of FIG. 2. Similarly, in FIG. 7, output lead 47' of amplifier 44 is connected to terminal D' of reference resistor 32; and lead 53' is connected from power supply common 48' to terminal B' of bolometer element 30. The input lead 45' is connected to terminal D of reference resistor 32, and input lead 46' is connected to terminal A of bolometer element 30. The embodiment of FIG. 7 is otherwise identical to the embodiment of FIG. 3. In FIG. 8, output 47' from amplifier 44 is connected to terminal D' of reference resistor 32; and lead 53' is connected from power supply common 48' to terminal B' of barretter 60. Input leads 45' and 46' of amplifier 44 are respectively connected to terminal C of reference 32 amd terminal B of barretter 60. The embodiment of FIG. 8 is otherwise identical to the embodiment of FIG. 4. In FIG. 9, output 47' of amplifier 44 is connected to terminal D' of barretter 60, while lead 53' is connected from power supply common 48' to terminal B' of reference resistor 32. Input leads 45' and 46' of amplifier 44 are connected respectively to terminals D of barretter 60 and A of reference resistor 32. The embodiment of FIG. 9 is otherwise identical to the embodiments of FIG. 5. Although the circuit configurations of the embodiments of FIGS. 6, 7, 8 and 9 differ from those of FIGS. 2, 3, 4 and 5, respectively, in each of these configurations a current loop is established and the operation is essentially the same as the operation of the embodiments of FIGS. 2, 3, 4 and 5.

Successful operation of the embodiments of the present invention is enhanced by employing, as amplifiers 34 and 44, high quality, high gain operational amplifiers, having a gain which is not less than 100,000.

Although the invention has been described particularly as a system for measuring R.F. and microwave power by means of D.C.-substitution, the principles of the invention are also applicable to hot-wire anemometers of the constant-resistance or constant-temperature type. In a hot-wire anemometer application, the transducer resistor element 30 or 60 is placed in the wind, the velocity of which is to be measured. The voltage measured under these conditions is then compared with the voltage measurement in the absence of the wind.

While preferred embodiments of the invention have been shown and described, it will be apparent to those skilled in the art that changes can be made without departing from the principles and spirit of the invention, the scope of which is described in the appended claims.

The invention claimed is:

1. A self-balancing D.C.-substitution measuring system comprising:
   a temperature-dependent transducer resistor element;
   a substantially temperature-independent reference resistor element;
   first differential amplifying means having a first and a second input terminal, an output terminal, and a power supply;
   second differential amplifying means having a first and a second input terminal, an output terminal, and a power supply;
   means connecting one of said elements between said output terminals of said differential amplifying means;
   means connecting the other of said elements between said power supplies to complete a current loop;
   means connecting said first input terminal of said first amplifying means to one end of one of said elements;
   means connecting said second input terminal of said first amplifying means to one end of the other of said elements;
   means connecting said first terminal of said second amplifying means to the other end of said one of said elements;
   means connecting said second input terminal of said second amplifying means to the other end of said other of said elements;
   said first amplifying means supplying current to said loop and said second amplifying means absorbing the current, the magnitude of the current being such that the potential between said input terminals of said first amplifying means is essentially equal to zero, the potential between said input terminals of said second amplifying means is essentially equal to zero, and the resistance of the transducer resistor element is thereby driven to equality with the resistance of the reference resistor element; and
   means providing a voltage from a pair of points on said current loop which is a function of direct current power dissipation in said transducer resistor element.

2. A measuring system as recited in claim 1, wherein said system is a radio frequency power measuring system and said transducer resistor element is a bolometer element placed in a radio frequency field, the power of which is to be measured.

3. A measuring system as recited in claim 1, wherein said system is a hot-wire anemometer system and said transducer resistor element is placed in the wind, the velocity of which is to be measured.

4. A measuring system as recited in claim 1, further comprising a voltmeter connected between said pair of points, said pair of points being first input terminal of said first amplifying means and said second input terminal of said second amplifying means.

5. A measuring system as recited in claim 1, wherein said power supplies are dual isolated power supplies, each having a center point, and said other element is connected between the center points of said power supplies.

6. A measuring system as recited in claim 1, wherein said one of said elements is said reference resistor element and said other element is said transducer resistor element.

7. A measuring system as recited in claim 1, wherein said one of said elements is said transducer resistor element and said other of said elements is said reference resistor element.

8. A measuring system as recited in claim 1, wherein said transducer resistor element is a thermistor having a negative temperature coefficient.

9. A measuring system as recited in claim 1, wherein said transducer resistor element is a barretter having a positive temperature coefficient.

10. A self-balanced D.C.-substitution system for the measurement of R.F. power comprising:
    a temperature dependent bolometer element;
    a substantially temperature independent reference resistor element;
    first amplifying means;
    second amplifying means;
    circuit means connecting said first amplifying means, said bolometer element, said second amplifying means, and said reference resistor element in a current loop, one of said amplifying means generating said current with a value to drive the resistance of said bolometer into equality with the resistance of said reference resistor element; and
    means for measuring a voltage from a pair of points on said current loop which is a function of direct current power dissipation in said bolometer element.

11. A measuring system as recited in claim 10, wherein said amplifying means comprise high gain differential amplifiers, each having two input terminals, one input terminal being connected to an end of one of the elements and the other input terminal being connected to an opposite end of the other element, the potential at said input terminals being driven to equality by said current.

12. A measuring system as recited in claim 11, wherein corresponding input terminals of each amplifying means are connected to opposite ends of the same element.

13. A measuring system as recited in claim 11, wherein oppositely poled input terminals of each amplifying means are connected to opposite ends of the same element.

14. A measuring system as recited in claim 11, wherein said current loop includes means connecting one of said elements between output terminals of said amplifying means and said other of said elements between power supply common terminals of said amplifying means.

15. A measuring system as recited in claim 11, wherein said current loop included means connecting said bolometer element between an output terminal of one of said amplifying means and a power supply common terminal of said other amplifying means and said reference resistor element between an output terminal of said other amplifying means and a power supply common terminal of said one amplifying means.

16. A measuring system as recited in claim 10, wherein said bolometer element is a thermistor.

17. A measuring system as recited in claim 10, wherein said bolometer element is a barretter.

18. A self-balanced D.C.-substitution system for the measurement of R.F. power comprising:
    a temperature dependent bolometer element;
    a stable reference resistor element;

first differential amplifying means having a first and a second input terminal, an output terminal, and a power supply;
second differential amplifying means having a first and a second input terminal, an output terminal, and a power supply;
means connecting one of said elements between said output terminal of one of said differential amplifying means and said power supply of said other of said differential amplifying means;
means connecting the other of said elements between said power supply of said one of said differential amplifying means and said output terminal of said other of said differential amplifying means to complete a current loop;
means connecting said first input terminal of said first amplifying means to one end of one of said elements;
means connecting said second input terminal of said first amplifying means to the other end of said other of said elements;
means connecting said second input terminal of said second amplifying means to the other end of said one of said elements;
means connecting said first input terminal of said second amplifying means to the one end of said other of said elements;
said first amplifying means supplying current to said loop and said second amplifying means absorbing the current, the magnitude of the current being such that the potential between said input terminals of said first amplifying means is essentially equal to zero, the potential between said input terminals of said second amplifying means is essentially equal to zero, and the resistance of the bolometer element is thereby driven to equality with the resistance of the reference resistor element; and
means providing a voltage from a pair of points on said current loop which is a function of direct current power dissipation in said bolometer element.

* * * * *